United States Patent
Shen et al.

(10) Patent No.: US 9,953,843 B2
(45) Date of Patent: Apr. 24, 2018

(54) CHAMBER FOR PATTERNING NON-VOLATILE METALS

(71) Applicant: Lam Research Corporation, Fremont, CA (US)

(72) Inventors: Meihua Shen, Fremont, CA (US); Shuogang Huang, San Jose, CA (US); Thorsten Lill, Santa Clara, CA (US); Theo Panagopoulos, San Jose, CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 15/017,444

(22) Filed: Feb. 5, 2016

(65) Prior Publication Data

US 2017/0229317 A1    Aug. 10, 2017

(51) Int. Cl.
| | |
|---|---|
| *C23F 1/00* | (2006.01) |
| *H01L 21/3213* | (2006.01) |
| *H01J 37/32* | (2006.01) |
| *C23C 14/50* | (2006.01) |
| *H01L 21/67* | (2006.01) |
| *H01L 21/687* | (2006.01) |

(52) U.S. Cl.
CPC ........ *H01L 21/32136* (2013.01); *C23C 14/50* (2013.01); *H01J 37/32715* (2013.01); *H01L 21/32135* (2013.01); *H01L 21/32138* (2013.01); *H01L 21/67069* (2013.01); *H01L 21/68735* (2013.01); *H01L 21/68764* (2013.01)

(58) Field of Classification Search
CPC ........... H01J 37/32733; H01J 37/32715; H01J 37/3266; H01J 37/32192; H01J 37/3229; H01L 21/31116; H01L 21/31144; H01L 21/32135; H01L 21/32136; H01L 21/67069; H01L 21/68735; C23C 14/50
USPC ........... 156/345.34, 345.35, 345.47, 345.51, 156/345.54; 438/706, 710, 714
See application file for complete search history.

(56) References Cited

U.S. PATENT DOCUMENTS

| | | | |
|---|---|---|---|
| 5,314,574 | A | 5/1994 | Takahashi |
| 5,429,070 | A | 7/1995 | Campbell et al. |
| 6,409,837 | B1 | 6/2002 | Hillman |
| 7,700,155 | B1 | 4/2010 | Juarez et al. |
| 8,865,597 | B2 | 10/2014 | Cotte et al. |
| 2002/0139302 | A1 | 10/2002 | Nagashima |

(Continued)

OTHER PUBLICATIONS

U.S. Office Action, dated Jul. 25, 2011, issued in U.S. Appl. No. 12/702,747.

(Continued)

*Primary Examiner* — Lan Vinh
(74) *Attorney, Agent, or Firm* — Weaver Austin Villeneuve & Sampson LLP

(57) ABSTRACT

Apparatuses suitable for etching substrates at various pressure regimes are described herein. Apparatuses include a process chamber including a movable pedestal capable of being positioned at a raised position or a lowered position, showerhead, and optional plasma generator. Apparatuses may be suitable for etching non-volatile metals using a treatment while the movable pedestal is in the lowered position and a high pressure exposure to organic vapor while the movable pedestal is in the raised position.

21 Claims, 10 Drawing Sheets

(56) References Cited

U.S. PATENT DOCUMENTS

| | | | |
|---|---|---|---|
| 2003/0013315 A1* | 1/2003 | Park | C23C 16/4583 438/710 |
| 2003/0023338 A1 | 1/2003 | Chin et al. | |
| 2003/0101938 A1* | 6/2003 | Ronsse | C23C 16/407 118/726 |
| 2003/0109094 A1 | 6/2003 | Seidel et al. | |
| 2003/0207032 A1 | 11/2003 | Ahn et al. | |
| 2003/0232495 A1* | 12/2003 | Moghadam | B05D 1/60 438/623 |
| 2003/0232512 A1 | 12/2003 | Dickinson et al. | |
| 2004/0003777 A1 | 1/2004 | Carpenter et al. | |
| 2005/0268856 A1 | 12/2005 | Miller et al. | |
| 2006/0102283 A1 | 5/2006 | Kwon et al. | |
| 2007/0068900 A1* | 3/2007 | Kim | H01J 37/32357 216/67 |
| 2008/0193673 A1* | 8/2008 | Paterson | H01J 37/32091 427/569 |
| 2009/0131295 A1 | 5/2009 | Cui | |
| 2010/0173074 A1 | 7/2010 | Juarez et al. | |
| 2011/0017706 A1* | 1/2011 | Takahashi | H01J 37/32192 216/69 |
| 2011/0232888 A1* | 9/2011 | Sasaki | H01J 37/32091 165/185 |
| 2013/0042811 A1* | 2/2013 | Shanker | C23C 16/04 118/723 R |
| 2013/0327480 A1* | 12/2013 | Carducci | H01J 37/3244 156/345.1 |
| 2014/0038418 A1* | 2/2014 | Bailey, III | H01L 21/02087 438/716 |
| 2014/0166618 A1 | 6/2014 | Tadigadapa et al. | |

OTHER PUBLICATIONS

U.S. Office Action, dated Mar. 5, 2012, issued in U.S. Appl. No. 12/702,747.

U.S. Final Office Action, dated Sep. 6, 2012, issued in U.S. Appl. No. 12/702,747.

U.S. Office Action, dated Jun. 11, 2013, issued in U.S. Appl. No. 12/702,747.

U.S. Final Office Action, dated Dec. 27, 2013, issued in U.S. Appl. No. 12/702,747.

U.S. Office Action, dated Dec. 19, 2014, issued in U.S. Appl. No. 12/702,747.

U.S. Final Office Action, dated May 18, 2015, issued in U.S. Appl. No. 12/702,747.

* cited by examiner

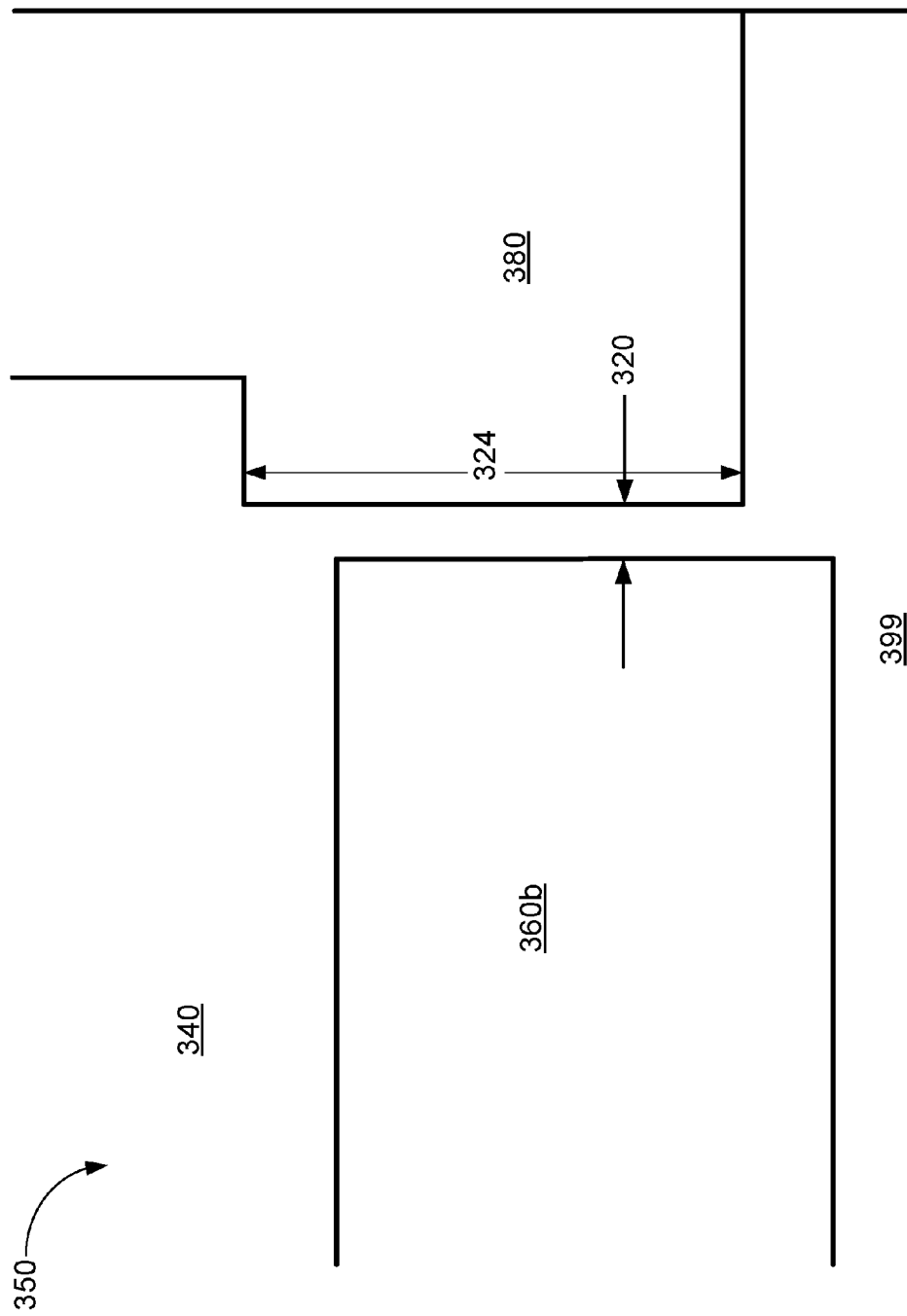

CHAMBER FOR PATTERNING NON-VOLATILE METALS

BACKGROUND

Semiconductor processing often involves etching non-volatile metals. However, non-volatile metals are often difficult to pattern using conventional dry plasma etch reactors because it is difficult to form volatile metal byproducts. As a result, conventional etch processes often result in redeposition of metals onto surfaces of a substrate, thereby leading to reliability issues and performance problems.

SUMMARY

Provided herein are apparatuses for processing semiconductor substrates. One aspect involves an apparatus for processing a semiconductor substrate, the apparatus including: a process chamber including: a showerhead for distributing process gases to the apparatus, a movable pedestal for holding the semiconductor substrate, the movable pedestal capable of being positioned in a raised or a lowered position such that the movable pedestal in the raised position forms an upper chamber region between the movable pedestal and the showerhead and a lower chamber region beneath the movable pedestal, a region near the showerhead capable of aligning with the edge of the movable pedestal when the pedestal is moved to the raised position; and inlets coupled to the showerhead for delivering process gases toward the showerhead; a plasma generator for igniting a plasma in the process chamber; and a controller for controlling operations of the apparatus, the controller including machine-readable instructions for moving the pedestal to the raised or lowered position, such that a pressure differential is formed between the upper chamber region and the lower chamber region when the movable pedestal is in the raised position.

In some embodiments, the distance between the edge of the movable pedestal and the region near the showerhead when the movable pedestal is in the raised position is between about 0.3 mm and about 3 mm. The region near the showerhead may be slanted at about 45° from an axis perpendicular to the showerhead. In some embodiments, the length of the slanted region near the showerhead is between about 50 mm and about 200 mm.

In some embodiments, the region near the showerhead is part of a sidewall of the apparatus. The distance between the showerhead and the movable pedestal in the upper chamber region when the pedestal is in the raised position may be between about 1 mm and about 2 mm.

In some embodiments, the movable pedestal includes a raised region adjacent to the edge of the pedestal. In various embodiments, the distance between a surface planar to the showerhead and the upper surface of the raised region is between about 0 mm and about 1 mm. The raised region may include an inner corner and an outer corner, such that the lateral distance between an edge of the showerhead and the inner corner is about 10 mm.

In various embodiments, the edge of the movable pedestal is slanted. The edge of the movable pedestal may be perpendicular to the surface of the movable pedestal. The movable pedestal may be capable of moving a distance between about 4 inches and about 6 inches between the lowered and the raised position. In some embodiments, the thickness of the movable pedestal may be between about 50 mm and about 100 mm.

The pressure differential between the upper chamber region and the lower chamber region when the pedestal is in the raised position may be between about 50 mTorr and about 5 Torr. In some embodiments, the pressure of the upper chamber region when the pedestal is in the raised position may be capable of being at least about 2 to about 10,000 times greater than the pressure of the chamber when the pedestal is in the lowered position.

In some embodiments, the inlets include an inlet for delivering an organic vapor to the process chamber at a flow rate greater than about 1000 sccm. The inlets may include an inlet for delivering a chlorine containing or oxygen-containing process gas to the showerhead to generate a plasma.

In some embodiments, the controller further includes machine-readable instructions for: introducing the plasma to a non-volatile metal on the substrate when the pedestal is in the lowered position to form a modified non-volatile metal on the substrate; and introducing an organic vapor to the chamber while the pedestal is in the raised position to etch the modified non-volatile metal.

Another aspect involves a method of etching non-volatile metal on a substrate in a process chamber including a movable pedestal for holding the substrate, the movable pedestal capable of being positioned in a raised or a lowered position such that the movable pedestal in the raised position forms an upper chamber region between the movable pedestal and the showerhead and a lower chamber region beneath the movable pedestal, the method including: exposing the non-volatile metal on the substrate on the movable pedestal to a plasma when the pedestal is in the lowered position to modify the non-volatile metal; and exposing the modified non-volatile metal to an organic vapor when the pedestal is in the raised position to remove the modified non-volatile metal, whereby a pressure differential is formed in the process chamber between the upper chamber region and the lower chamber region when the movable pedestal is in the raised position.

In various embodiments, the pressure of the upper chamber region when the pedestal is in the raised position is at least about 2 to about 10,000 times greater than the pressure of the chamber when the pedestal is in the lowered position.

These and other aspects are described further below with reference to the drawings.

BRIEF DESCRIPTION OF THE DRAWINGS

FIG. 3C provides a schematic illustration of a close-up depiction of a part of FIG. 3B.

DETAILED DESCRIPTION

In the following description, numerous specific details are set forth to provide a thorough understanding of the presented embodiments. The disclosed embodiments may be practiced without some or all of these specific details. In other instances, well-known process operations have not been described in detail to not unnecessarily obscure the disclosed embodiments. While the disclosed embodiments will be described in conjunction with the specific embodiments, it will be understood that it is not intended to limit the disclosed embodiments.

Semiconductor processing involves etching non-volatile metals, which are difficult to pattern and etch using conventional dry plasma etch reactors. Example non-volatile metals include copper, cobalt, platinum, palladium, iron, and iridium. Such non-volatile metals may have unique electric and magnetic properties and may therefore be used in advanced memory and logic applications, such as in fabrication of magnetoresistive random access memory (MRAM). In conventional plasma reactors, it is difficult to form volatile byproducts of non-volatile metals to etch these metals. It is desirable to form volatile etching byproducts because such material may be easily removed from the process chamber without being redeposited onto substrate surfaces. Conventionally, the metals may be dissolved in wet chemical solutions or may also be dissolved in an organic vapor solvent. However, shifting from a wet to dry etch environment takes time and thus reduces throughput. In addition, wet techniques may not necessarily be suitable for etching substrates at sub-10 nm technology nodes.

Apparatus

Provided herein are apparatuses suitable for and methods of etching non-volatile metals. Although example apparatuses described herein may be used for etching non-volatile metals, it will be understood that apparatuses described herein may be suitable for etching or processing any type of wafer.

Figure 1:
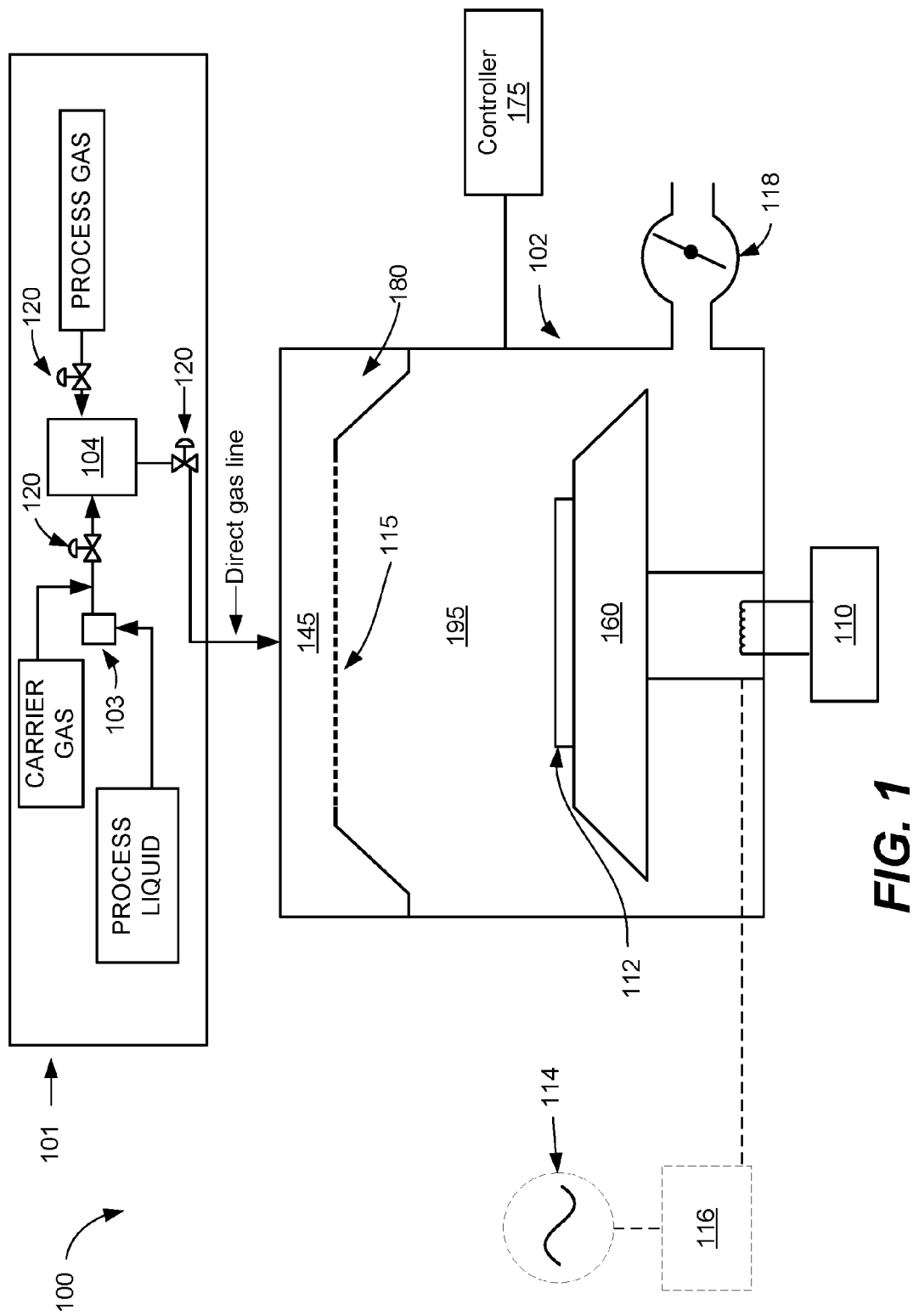
FIG. 1 provides a schematic illustration of an example apparatus in accordance with disclosed embodiments.

In various embodiments, the apparatus includes a dual zone pressure plasma reactor or process chamber which may be configured to include an upper chamber region and a lower chamber region. FIG. 1 provides a schematic illustration of an example apparatus 100 including a process chamber 102. Process chamber 102 may include showerhead 115 for delivering process gases to process region 195. The sidewall of process chamber 102 may be slanted such that a region 180 of the process chamber sidewall at or near the showerhead 115 aligns with a slanted edge of pedestal 160, which is capable of moving vertically up (to a raised position) and down (to a lowered position) in the process chamber 102. Note that although the region 180 is slanted and the pedestal edge shown in FIG. 1 is slanted, in some embodiments, the region 180 aligns vertically with a vertical pedestal edge. The pedestal 160 may hold a wafer or substrate 112 upon which processing may be performed. The thickness of pedestal 160 may be between about 50 mm and about 100 mm. In some embodiments, the pedestal 160 serves as a cathode for generating a plasma in-situ as described below.

Showerhead 115 distributes process gases toward wafer 112. In the embodiment shown in FIG. 1, the wafer 112 is located beneath showerhead 115 and is shown resting on pedestal 160. Showerhead 115 may have any suitable shape and may have any suitable number and arrangement of ports for distributing process gases to wafer 112. The showerhead 115 may separate the process chamber 102 between region 145 and process region 195. In some embodiments, gases may be delivered to region 145 at a pre-selected pressure prior to delivering the gases via showerhead 115 to the wafer 112. In some embodiments, pedestal 160 may be in a raised position or in a lowered position to expose wafer 112 to a volume between wafer 112 and the showerhead 115. The distance that the pedestal 160 may be moved between the raised and lowered positions may depend on the size of the chamber. The terms "raised" and "lowered" as used herein are relative along an axis where the surface of pedestal 160 is substantially parallel to the ground. In some embodiments, the raised position is one in which the surface of pedestal 160 is closer to the facing surface of the chamber 102 such as the location in which a showerhead 115 may be placed in a chamber 102. In some embodiments, the distance that the pedestal 160 may be moved between the raised and lowered positions may be between about 4 inches and about 6 inches. It will be appreciated that in some embodiments pedestal height may be adjusted programmatically by a suitable controller 175.

Note that in various embodiments, process region 195 may be divided into two regions when the pedestal 160 is in a raised position, as described further below with respect to FIGS. 2A and 2B. In some embodiments, adjusting a height of pedestal 160 may allow a plasma density to be varied during plasma processes described herein. At the conclusion of a process phase, pedestal 160 may be lowered for performing another operation of wafer 112 or another wafer transfer phase to allow removal of the wafer 112 from pedestal 160. In some embodiments, pedestal 160 may include a rotational axis for rotating an orientation of wafer 112. It will be appreciated that, in some embodiments, one or more of these example adjustments may be performed programmatically by one or more suitable controllers 175. Controller 175 may be any of the controllers described below with respect to FIGS. 3A and 3B.

In some embodiments, pedestal 160 may be temperature controlled via heater 110. Further, in some embodiments, pressure control for apparatus 100 may be provided by butterfly valve 118. As shown in the embodiment of FIG. 1, butterfly valve 118 throttles a vacuum provided by a downstream vacuum pump (not shown). However, in some embodiments, pressure control of apparatus 100 may also be adjusted by varying a flow rate of one or more gases introduced to the apparatus 100.

Process chamber 102 may fluidly communicate with a reactant delivery system 101 for delivering process gases or vapor to a showerhead 115. Reactant delivery system 101 includes a mixing vessel 104 for blending and/or conditioning process gases, such as etching gases, for delivery to showerhead 115. A separate mixing vessel (not shown) may be used for blending and/or conditioning organic vapor gases. One or more mixing vessel inlet valves 120 may control introduction of process gases to mixing vessel 104. Etching plasma may also be delivered to the showerhead 115 or may be generated in the process chamber 102.

As an example, the embodiment of FIG. 1 includes a vaporization point 103 for vaporizing liquid reactant to be supplied to the mixing vessel 104. In some embodiments, vaporization point 103 may be a heated vaporizer. The saturated reactant vapor produced from such vaporizers may condense in downstream delivery piping. Exposure of incompatible gases to the condensed reactant may create small particles. These small particles may clog piping, impede valve operation, contaminate substrates, etc. Some approaches to addressing these issues involve purging and/or evacuating the delivery piping to remove residual reactant. However, purging the delivery piping may increase process station cycle time, degrading process station throughput. Thus, in some embodiments, delivery piping downstream of vaporization point 103 may be heat traced. In some examples, mixing vessel 104 may also be heat traced. In one non-limiting example, piping downstream of vaporization point 103 has an increasing temperature profile extending from approximately 100° C. to approximately 150° C. at mixing vessel 104.

In some embodiments where plasma may be used, showerhead 115 and pedestal 160 electrically communicate with a radio frequency (RF) power supply 114 and matching network 116 for powering a plasma. In some embodiments, the plasma energy may be controlled by controlling one or more of a process station pressure, a gas concentration, an RF source power, an RF source frequency, and a plasma power pulse timing. For example, RF power supply 114 and matching network 116 may be operated at any suitable power to form a plasma having a desired composition of plasma species. Likewise, RF power supply 114 may provide RF power of any suitable frequency. In some embodiments, RF power supply 114 may be configured to control high- and low-frequency RF power sources independently of one another. Example low-frequency RF frequencies may include, but are not limited to, frequencies between 0 kHz and 500 kHz. Example high-frequency RF frequencies may include, but are not limited to, frequencies between 1.8 MHz and 2.45 GHz, or greater than about 13.56 MHz, or greater than 27 MHz, or greater than 40 MHz, or greater than 60 MHz. It will be appreciated that any suitable parameters may be modulated discretely or continuously to provide plasma energy for the surface reactions.

In some embodiments, the plasma may be monitored in-situ by one or more plasma monitors (not shown). In one scenario, plasma power may be monitored by one or more voltage, or current sensors (e.g., VI probes). In another scenario, plasma density and/or process gas concentration may be measured by one or more optical emission spectroscopy sensors (OES). In some embodiments, one or more plasma parameters may be programmatically adjusted based on measurements from such in-situ plasma monitors. For example, an OES sensor may be used in a feedback loop for providing programmatic control of plasma power. It will be appreciated that, in some embodiments, other monitors may be used to monitor the plasma and other process characteristics. Such monitors may include, but are not limited to, infrared (IR) monitors, acoustic monitors, and pressure transducers.

Figure 2A:
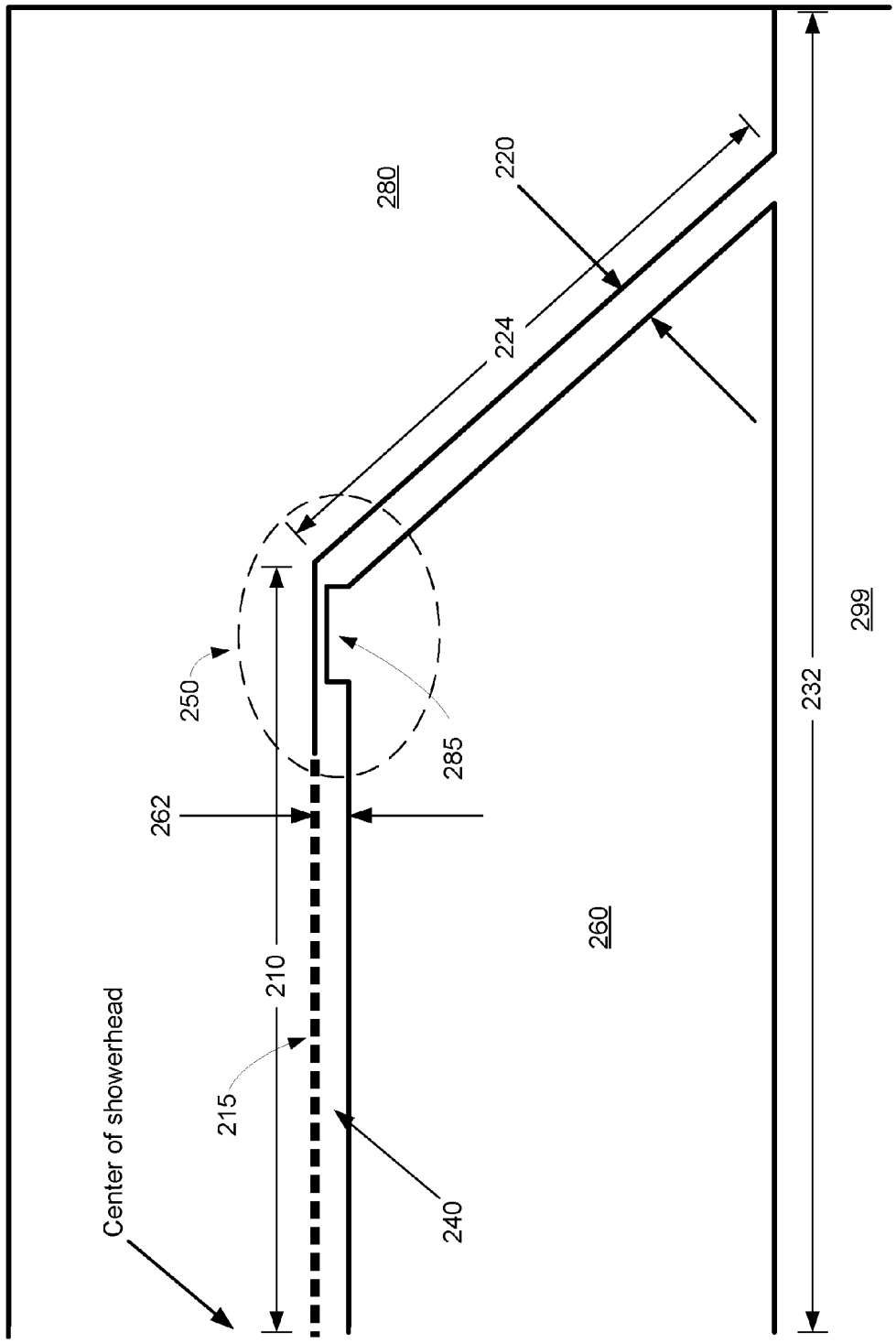
FIG. 2A provides a schematic illustration of a close-up depiction of a part of the example apparatus of FIG. 1.

FIG. 2A shows a zoomed in embodiment of region 180 of FIG. 1 with pedestal 260 in the raised position without a wafer on the surface of the pedestal 260. Note that although not depicted in FIG. 2A, a wafer may rest on the pedestal 260 below the showerhead 215 such that the wafer is positioned on the pedestal 260 between the showerhead 215 and the surface of the pedestal 260.

As shown in FIG. 2A, when the pedestal 260 is in the raised position, process space 195 of FIG. 1 may be separated into an upper chamber region 240 and a lower chamber region 299. The upper chamber region 240 may be defined as the area of the process chamber between the showerhead 215 and the wafer when the pedestal 260 is in the raised position.

In various embodiments, the showerhead 215 may be separated from the surface of the pedestal 260 by a gap 262. Gap 262 may be defined as the distance between the showerhead 215 and the flat region (i.e. not the raised region depicted in 250) of the top of the surface of pedestal 260 as depicted in FIG. 2A. Gap 262 may be about 1 mm. In some embodiments, the gap 262 may be the distance between the showerhead 215 and the wafer on the pedestal 260 such that the gap 262 defines the size of the upper chamber region 240.

The size of the gap 220 and the length 224 of the slanted region 280 may be modulated to generate a pressure differential or pressure difference between upper chamber region 240 and lower region 299. The pressure differential between the upper chamber region and the lower chamber region when the pedestal is in the raised position may be between about 50 mTorr and about 5 Torr. This may be used in some embodiments to form a high pressure environment in upper chamber region 240. For example, in some embodiments, it may be suitable to expose a wafer to a high pressure environment. Formation of the upper chamber region 240 being capable of establishing a high pressure environment allows a wafer to be exposed to both high and low pressure environments in the same process chamber by moving the pedestal 260 between a raised and a lowered position, thereby improving efficiency of wafer processing and throughput. Gap 220 may be defined as the width defined by the shortest distance between one point on the sloped sidewall of the chamber and a point on the sloped edge of pedestal 260. In various embodiments, gap 220 may be between about 0.3 mm and about 3 mm.

In some embodiments, the showerhead 215 may have a radius of about 150 mm. In some embodiments, the showerhead 215 may be coated with a thin layer of material, such as $Y_2O_3$, and may be a grounded aluminum plate. In some embodiments, the showerhead may be assembled at the top of the process chamber whereby the showerhead 215 does not span the entire length of the top of the process chamber and the distance 210 between the center of the showerhead and the point in which the process chamber wall is slanted in region 280 is about 165 mm. For example, in some embodiments, the distance between the edge of the showerhead and the edge where the sidewall of the process chamber is slanted may be about 15 mm. In various embodiments, the distance 232 from the center of the pedestal to the edge of the vertical sidewall of the process chamber may be between about 200 mm and about 300 mm. The length 224 of the slanted region 280 may be between about 50 mm and about 200 mm.

In some embodiments, an inert gas (which may be referred to as a "curtain gas") is used to prevent the diffusion or leaking of gases such as an organic vapor from the upper chamber region 240 to the lower chamber region 299. The inert gas maybe injected along gap 220, and it may be pumped out by a series of holes (not shown) on the outer diameter of showerhead 215.

As shown in FIG. 2A, the pedestal 260 may have a raised region 285 at the edge of the pedestal 260 such that when a wafer is placed on the pedestal 260, the raised region 285 surrounds the edge of the wafer. The raised region 285 is depicted in 250 and FIG. 2B provides a zoomed-in close up depiction of this region. As shown in FIG. 2B, showerhead 215 is at or near the top of the process chamber, with the edge of the showerhead 215 being a distance 275 away from the inner edge of the raised region 285 of the pedestal 260. Distance 275 may be about 10 mm. The width 270 of the raised region 285 may be about 5 mm in some embodiments.

The raised region 285 may have a thickness greater than a thickness of a wafer being processed such that if the raised region 285 contacts the top of the process chamber that extends from the edge of the showerhead, the pedestal forms the upper chamber region 240 that is closed off from the rest of the process region 195. In some embodiments, the raised region 285 may completely separate the upper chamber region 240 from lower chamber region 299 by enclosing the upper chamber region 240 such that in some embodiments, the gap 278 may be 0 mm. The raised region 285 may help maintain a pressure differential between the upper chamber region 240 of FIG. 2A and the lower chamber region 299 of the chamber. Referring to FIG. 2B, the angle 272 in which the sloped region deviates from the edge of the pedestal may be about 45° C. Distance 271 between the outer edge of the raised region 285 and the point at which the top of the process chamber is slanted may be between about 1 mm and about 2 mm.

Figure 2B:
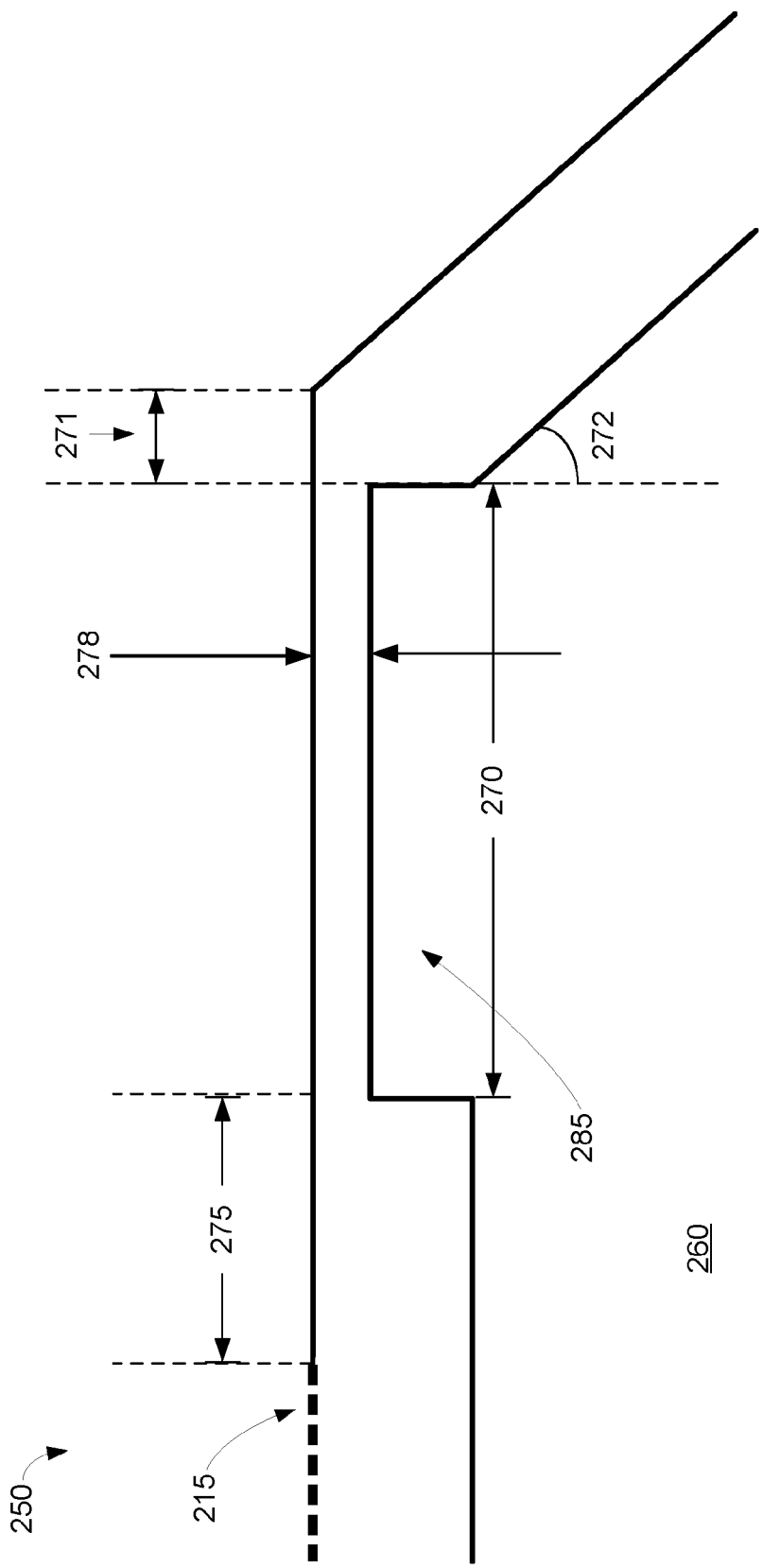
FIG. 2B provides a schematic illustration of a close-up depiction of a part of FIG. 2A.

Note that although FIGS. 1, 2A, and 2B depict a pedestal with sloped edges with corresponding sloped edges of a process chamber sidewall at or near the showerhead, in some embodiments, the edges may not be sloped. Example embodiments of a chamber including a pedestal with vertical edges with corresponding vertical sidewalls at a region at or near the showerhead of a process chamber are provided in FIGS. 3A-3C.

Figure 3A:
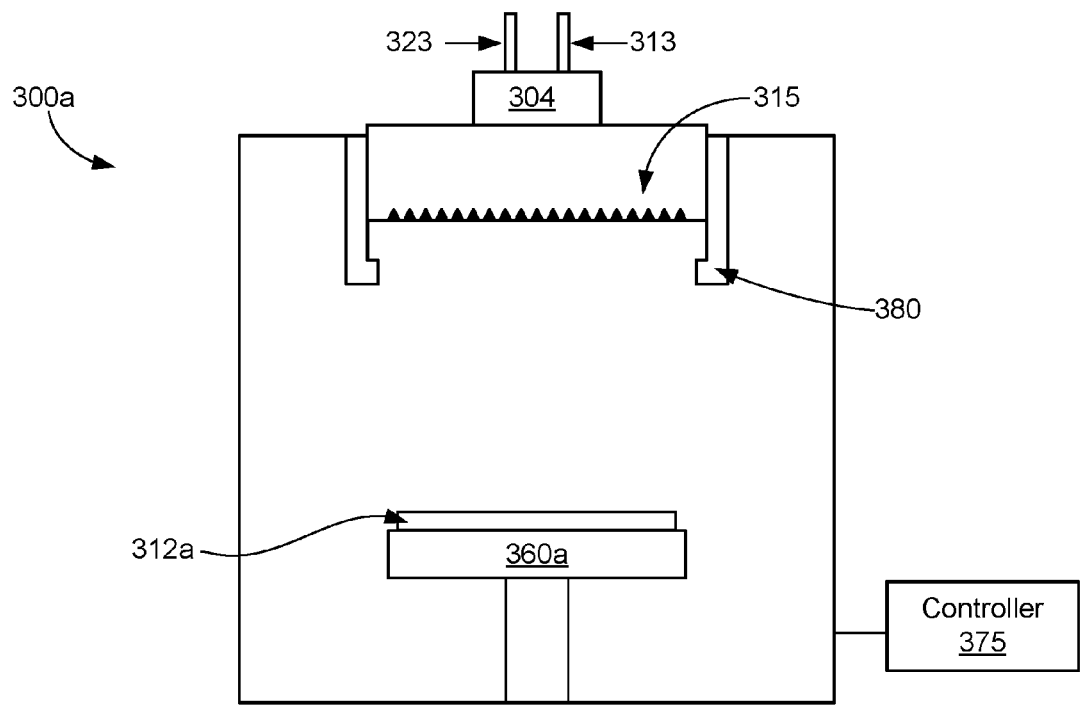
FIG. 3A provides a schematic illustration of an example apparatus with the pedestal in the lowered position.

FIG. 3A shows a chamber 300a with the pedestal 360a in the lowered position. Chamber 300a depicted in FIGS. 3A and 3B may be part of a multi-station tool, such as a two-station tool or a four-station tool. In some embodiments, chamber 300a may be a single-station tool. Disclosed embodiments may be performed in one or more stations or chambers.

Figure 3B:
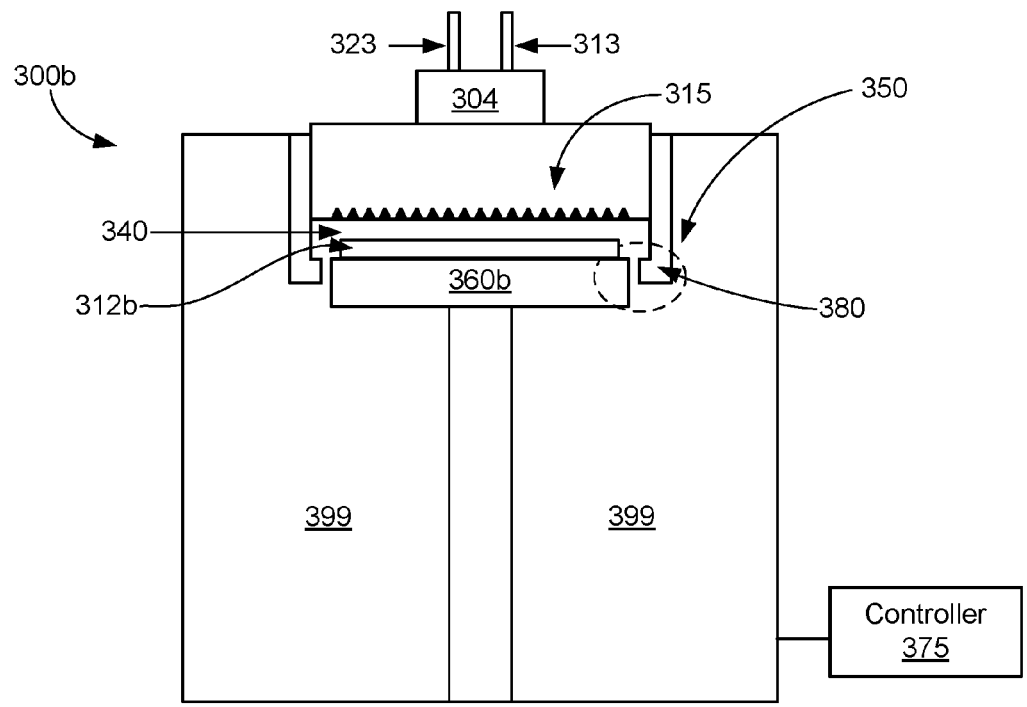
FIG. 3B provides a schematic illustration of an example apparatus with the pedestal in the raised position.

Wafer 312a sits on the surface of pedestal 360a. The chamber 300a includes a showerhead 315. Showerhead 315 may include a carrier gas inlet 323 and a vapor heated inlet 313 for delivering gases to mixing vessel 304 prior to delivery to the showerhead 315. Showerhead 315 may be coupled to region 380, which may be used to establish a pressure differential between an upper chamber region 340 and a lower chamber region 399 when the pedestal 360b is in the raised position as shown in FIG. 3B. Note that in FIG. 3B, wafer 312b is placed within the confines of region 380 and an upper chamber region 340 is formed.

FIG. 3C shows a zoomed in depiction of region 380. As shown in FIG. 3C, the pedestal 360b is positioned adjacent to region 380 while leaving a gap 320. Distance 324 may be the height of the region 380 used to help establish a pressure differential between upper chamber region 340 and lower chamber region 399. The width of gap 320 may be any of the distances described above with respect to distance 220 of FIG. 2A. The distance 324 may be any of the lengths described above with respect to distance 224 of FIG. 2A.

Referring to FIGS. 3A and 3B, movement of the pedestal 360a from a lowered position to a raised position as shown in FIG. 3B may be controlled by a system controller 375. Variation of the flow rate of process gases to and from the process chamber 300a may also be controlled by the system controller 375.

System controller 375 may include one or more memory devices, one or more mass storage devices, and one or more processors. Processors may include a CPU or computer, analog, and/or digital input/output connections, stepper motor controller boards, etc.

In some embodiments, system controller 375 controls all of the activities of process chamber 300a. System controller 375 executes system control software stored in a mass storage device, loaded into a memory device, and executed on a processor. Alternatively, the control logic may be hard coded in the controller 375. Applications Specific Integrated Circuits, Programmable Logic Devices (e.g., field-programmable gate arrays, or FPGAs) and the like may be used for these purposes. In the following discussion, wherever "software" or "code" is used, functionally comparable hard coded logic may be used in its place. System control software may include instructions for controlling the pedestal position, timing, mixture of gases, gas flow rates, chamber and/or station pressure, chamber and/or station temperature, target power levels, RF power levels, pedestal temperature, chuck and/or susceptor position, and other parameters of a particular process performed by process chamber 300a. System control software may be configured in any suitable way. For example, various process tool component subroutines or control objects may be written to control operation of the process tool components used to carry out various process tool processes. System control software may be coded in any suitable computer readable programming language.

In some embodiments, system control software may include input/output control (IOC) sequencing instructions for controlling the various parameters described above. Other computer software and/or programs stored on mass storage device and/or memory device associated with system controller 375 may be employed in some embodiments. Examples of programs or sections of programs for this purpose include a wafer positioning program, a process gas control program, a pressure control program, a heater control program, and a plasma control program.

A wafer positioning program may include program code for process tool components that are used to load the wafer onto pedestal 360a and to control the spacing between the wafer and other parts of process chamber 300a.

A process gas control program may include code for controlling gas composition (e.g., iodine-containing silicon precursor gases, and nitrogen-containing gases, carrier gases and purge gases as described herein) and flow rates and optionally for flowing gas into one or more process stations prior to deposition in order to stabilize the pressure in the process station. A pressure control program may include code for controlling the pressure in the process station by regulating, for example, a throttle valve in the exhaust system of the process station, a gas flow into the process station, etc.

A heater control program may include code for controlling the current to a heating unit that is used to heat the wafer. Alternatively, the heater control program may control delivery of a heat transfer gas (such as helium) to the wafer.

A plasma control program may include code for setting RF power levels applied to the process electrodes in one or more process stations in accordance with the embodiments herein.

A pressure control program may include code for maintaining the pressure in the reaction chamber in accordance with the embodiments herein.

In some embodiments, there may be a user interface associated with system controller 375. The user interface may include a display screen, graphical software displays of the apparatus and/or process conditions, and user input devices such as pointing devices, keyboards, touch screens, microphones, etc.

In some embodiments, parameters adjusted by system controller 375 may relate to process conditions. Non-limiting examples include process gas composition and flow rates, temperature, pressure, plasma conditions (such as RF bias power levels), etc. These parameters may be provided to the user in the form of a recipe, which may be entered utilizing the user interface.

Signals for monitoring the process may be provided by analog and/or digital input connections of system controller 375 from various process tool sensors. The signals for controlling the process may be output on the analog and digital output connections of process chamber 300a. Non-limiting examples of process tool sensors that may be monitored include mass flow controllers, pressure sensors (such as manometers), thermocouples, etc. Appropriately programmed feedback and control algorithms may be used with data from these sensors to maintain process conditions.

System controller 375 may provide program instructions for implementing the above-described deposition processes. The program instructions may control a variety of process parameters, such as DC power level, RF bias power level, pressure, temperature, etc. The instructions may control the parameters to operate in-situ deposition of film stacks according to various embodiments described herein.

The system controller 375 will typically include one or more memory devices and one or more processors configured to execute the instructions so that the apparatus will perform a method in accordance with disclosed embodiments. Machine-readable media containing instructions for controlling process operations in accordance with disclosed embodiments may be coupled to the system controller 375.

In some implementations, the system controller 375 is part of a system, which may be part of the above-described examples. Such systems can include semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The system controller 375, depending on the processing conditions and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the system controller 375 may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the system controller 375 in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The system controller 375, in some implementations, may be a part of or coupled to a computer that is integrated with, coupled to the system, otherwise networked to the system, or a combination thereof. For example, the system controller 375 may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the system controller 375 receives instructions in the form of data, which specify parameters for each of the processing steps to be performed during one or more operations. It should be understood that the parameters may be specific to the type of process to be performed and the type of tool that the system controller 375 is configured to interface with or control. Thus as described above, the system controller 375 may be distributed, such as by including one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an ALD chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the system controller 375 might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

An appropriate apparatus for performing the methods disclosed herein is further discussed and described in U.S. patent application Ser. No. 13/084,399 (now U.S. Pat. No. 8,728,956), filed Apr. 11, 2011, and titled "PLASMA ACTIVATED CONFORMAL FILM DEPOSITION"; and U.S. patent application Ser. No. 13/084,305, filed Apr. 11, 2011, and titled "SILICON NITRIDE FILMS AND METHODS," each of which is incorporated herein in its entireties.

In some embodiments, process chamber 300a (or apparatus 100 of FIG. 1) may be implemented in a larger apparatus or tool for handling wafers.

The apparatus/process described herein may be used in conjunction with lithographic patterning tools or processes, for example, for the fabrication or manufacture of semiconductor devices, displays, LEDs, photovoltaic panels and the like. Typically, though not necessarily, such tools/processes will be used or conducted together in a common fabrication facility. Lithographic patterning of a film typically includes some or all of the following operations, each operation enabled with a number of possible tools: (1) application of photoresist on a workpiece, i.e., wafer, using a spin-on or spray-on tool; (2) curing of photoresist using a hot plate or furnace or UV curing tool; (3) exposing the photoresist to visible or UV or x-ray light with a tool such as a wafer stepper; (4) developing the resist so as to selectively remove resist and thereby pattern it using a tool such as a wet bench; (5) transferring the resist pattern into an underlying film or workpiece by using a dry or plasma-assisted etching tool; and (6) removing the resist using a tool such as an RF or microwave plasma resist stripper.

Method

The apparatuses described herein may be used to implement a variety of methods on wafers such as semiconductor substrates. One example method is described herein as an example of an application of the disclosed embodiments.

As noted above, non-volatile metals are often difficult to etch in conventional apparatuses. However, disclosed apparatuses described herein may be used to efficiently etch non-volatile metals using a high pressure phase and a low pressure phase within the same process chamber such that a substrate including non-volatile metals may be exposed to organic vapors in a high pressure region to etch modified non-volatile metals that were modified in a prior exposure to a plasma. The advantages of performing etching operations of non-volatile metals in disclosed embodiments of apparatuses described herein include ability to perform the etch in one or more chambers or stations and ability to perform a dry etch process without having to transfer a substrate between wet and dry processes.

Figure 4A:
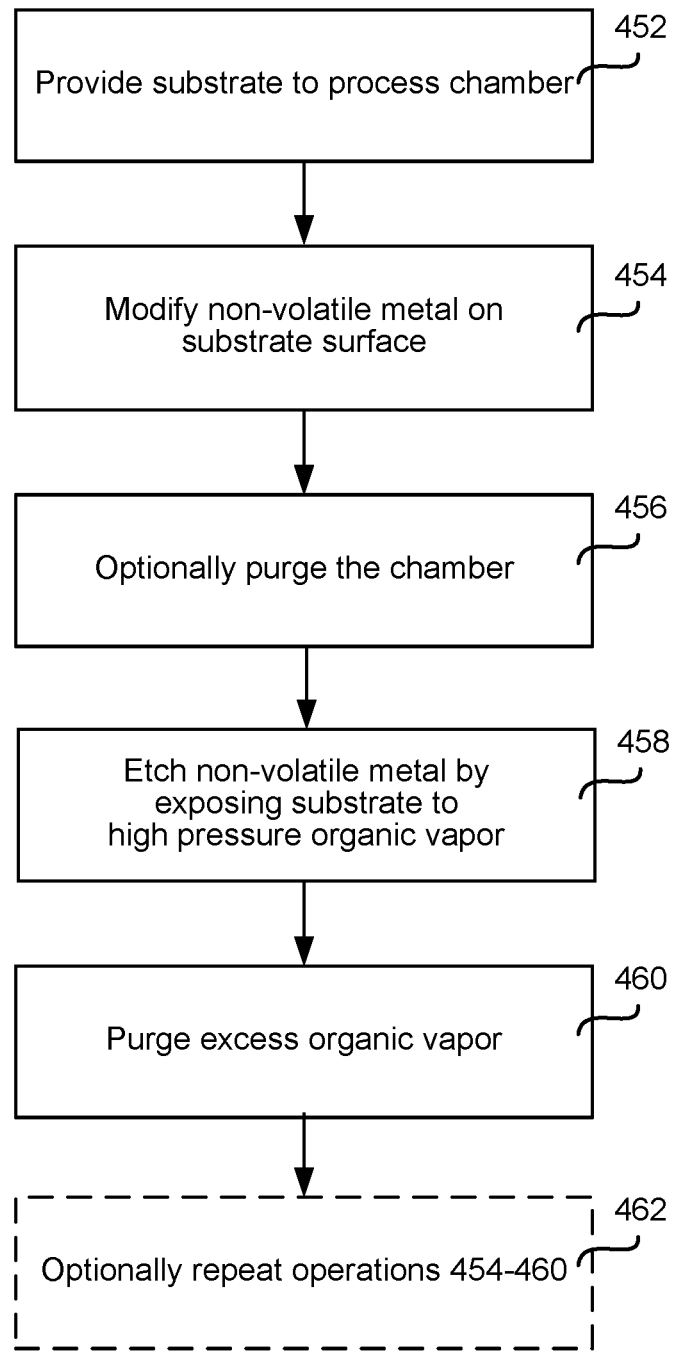
FIG. 4A is a process flow diagram of operations for performing a method that may be performed in accordance with disclosed embodiments.

FIG. 4A shows a process flow diagram for performing operations that may be performed in disclosed embodiments of apparatuses. In operation 452, a substrate is provided to the process chamber.

The substrate may be a silicon wafer, e.g., a 200-mm wafer, a 300-mm wafer, or a 450-mm wafer, including wafers having one or more layers of material, such as dielectric, conducting, or semi-conducting material deposited thereon. Non-limiting examples of under-layers include dielectric layers and conducting layers, e.g., silicon oxides, silicon nitrides, silicon carbides, metal oxides, metal nitrides, metal carbides, and metal layers. In various embodiments, the substrate may include non-volatile metals and may be used to form a magnetic device.

The process chamber may be any suitable chamber. In various embodiments, disclosed methods described herein may be performed in a single chamber. In some embodiments, the process chamber may be any of those described above with respect to FIGS. 1-3C. In some embodiments, methods described herein may be performed in two chambers, such as in a two-station tool. In some embodiments, disclosed embodiments may be performed in four chambers, such as in a four-station tool. One or more operations described in FIG. 4A may be performed in different stations of the same tool, or in the same station. Multi-station tools may process multiple wafers at the same time.

In operations 454-460, an inert gas may be flowed. In various embodiments, the inert gas is used as a carrier gas. Example carrier gases include argon, helium, and neon. In some embodiments, a hydrogen-containing carrier gas may be used. In some embodiments, the carrier gas is used as a purge gas in some operations. In some embodiments, the carrier gas is diverted. The inert gas may be provided to assist with pressure and/or temperature control of the process chamber, evaporation of a liquid reactant, more rapid delivery of the reactant and/or as a sweep gas for removing process gases from the process chamber and/or process chamber plumbing.

In operation 454, the substrate surface including a non-volatile metal may be modified. Modifying the surface of the substrate may allow non-volatile metal to be more susceptible to etch using an organic vapor in later processing as described below. In some embodiments, modifying the surface may include exposing the substrate to a bias to perform anisotropic etching. For example, in some embodiments, the substrate may be etched to achieve an undercut by using a bias to alter the angle of the projectile of the plasma reactive species from the showerhead to the substrate surface. In various embodiments, the undercut may be measured by the ratio of the vertical to lateral etch of a substrate. For example, in some embodiments, the ratio of vertical to lateral etch may be between about 1 to infinity. In some embodiments, the ratio may be between about 0.5 and about 50.

Operation 454 may be performed using a variety of methods. For example, in some embodiments, the substrate surface may be modified using reactive ion plasma. In some embodiments, the substrate surface may be modified using ion beam etching. In some embodiments, the substrate surface may be modified using a non-reactive plasma treatment.

Plasma treatments may oxidize or reduce non-volatile metals on the surface of the substrate. For example, a plasma treatment may result in chlorination of metal, oxidation of metal, hydrogen exposure to the metal, or any combination of these treatments. For example, in some embodiments, operation 454 may include flowing oxygen, chlorine, and/or hydrogen and igniting a plasma. Treatment time may depend on the substrate and the type of metal on the surface of the substrate. The treatment time may be selected to modify a monolayer or more than a monolayer of the substrate surface. The treatment time may also depend on the type of organic vapor used in subsequent operations as described below. Example treatment times include between about 0.5 seconds and about 60 seconds. Operation 454 is the rate limiting step such that the amount of material that is modified on the substrate surface during operation 454 determines how much of the substrate will be etched in a cycle. One cycle may be defined as the operations performed to etch a selected amount of a material on the surface of the substrate. For example, operations 454-460 may constitute one cycle.

In many embodiments, the substrate surface may be modified using a plasma generated in-situ. Plasma may be generated in-situ to prevent plasma from flowing from the showerhead to the substrate because in subsequent operations, organic vapors may be generated at or near the showerhead and contact between a plasma and the organic vapors may result in redeposition of undesired material onto the substrate surface.

In some embodiments, a remote plasma may be used in subsequent repeated operations of performing operation 454 if the chamber is completely purged as described below.

Operation 454 may be performed in a low pressure phase. For example, in some embodiments, the chamber pressure during operation 454 may be between about 4 mTorr and about 500 mTorr.

In some embodiments, the chamber is purged after performing operation 454 but before performing operation 458. Purging the chamber may involve flowing a purge gas or a sweep gas, which may be a carrier gas used in other operations or may be a different gas. In some embodiments, purging may involve evacuating the chamber. Example purge gases include argon, nitrogen, hydrogen, and helium. In some embodiments, purging may include one or more evacuation subphases for evacuating the process chamber. Alternatively, it will be appreciated that purging may be omitted in some embodiments. The chamber may be purged for any suitable duration, such as between about 0 seconds and about 60 seconds, for example about 0.01 seconds. In some embodiments, increasing a flow rate of one or more purge gases may decrease the duration of purging. For example, a purge gas flow rate may be adjusted according to various reactant thermodynamic characteristics and/or geometric characteristics of the process chamber and/or process chamber plumbing for modifying the duration of the purging. In one non-limiting example, the duration of a purge phase may be adjusted by modulating purge gas flow rate. This may reduce cycle time, which may improve substrate throughput. After a purge, the modified non-volatile metals (such as chlorinated non-volatile metals or oxidized non-volatile metals) may remain on the substrate surface.

In operation 458, the modified non-volatile metal may be etched by exposing the substrate to an organic vapor in a high pressure environment. In various embodiments, the substrate is exposed to an organic vapor that is flowed into an upper chamber region as shown in FIGS. 2B, and 3C. The pressure may be selected such that the pressure is high enough to etch the modified surface of the substrate. For example, in some embodiments, the pressure may be between about 0.5 Torr and about 50 Torr. In various embodiments, high pressure of the upper chamber region may be between about 2 times and about 10,000 times greater than the pressure of the chamber during operation 454.

One or more organic vapors may be flowed into the upper chamber region during this operation. Organic vapors may be selected depending on a combination of factors, including the geometry of the organic compound and steric hindrance considerations, reactivity with the modified surface of the substrate, the type of metal being etched, and the type of treatment performed in operation 454. The selection of organic vapors may affect the effectiveness of the removal of the modified substrate surface during this operation. Example organic vapors include carboxylic acids having a chemical formula of R—COOH where R is any organic group or hydride. Example organic vapors include formic acid, acetylacetonate, acetic acid, and other acetylacetonates. In various embodiments, when an organic vapor reacts with the modified substrate surface, a volatile material is formed and easily removed from the substrate surface and purged from the chamber.

In operation 460, the chamber is purged to remove excess organic vapor from the upper chamber region. The chamber is purged after turning off flow of the organic vapor to the process chamber. The chamber may be purged using any of the gases and methods described above with respect to operation 456. The chamber is purged to prevent any excess organic vapor from being ignited by plasma in any subsequent operations.

In operation 462, operations 454-460 may be optionally repeated. Whether the operations are repeated may depend on the amount of metal on the substrate surface to be etched. As noted above, operations 454-460 may constitute one etching cycle. Any suitable number of etching cycles may be performed to etch the desired amount of material such as a non-volatile metal from the surface of the substrate. The chamber may be purged between operations as described above to separate the organic vapor exposure and the modification operations to prevent the organic vapor from being ignited by modification chemistry in operation 454.

Figure 4B:
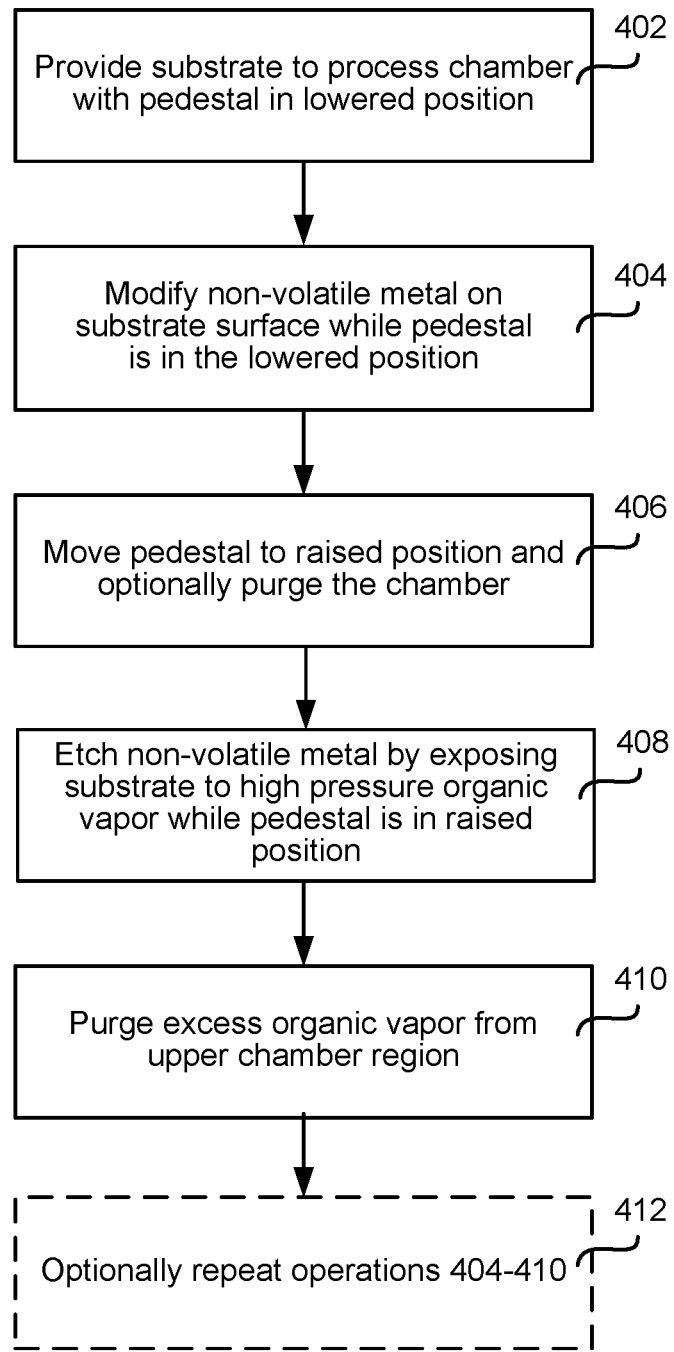
FIG. 4B is a process flow diagram of operations for performing a method that may be performed in an apparatus in accordance with disclosed embodiments.

FIG. 4B shows a process flow diagram for performing operations that may be performed in certain disclosed embodiments of apparatuses. In operation 402, a substrate is provided to the process chamber. The process chamber may be any suitable chamber capable of forming a high pressure region and a low pressure region for performing various operations. Example suitable process chambers are those described above with respect to FIGS. 1, 2A, 2B, and 3A-3C.

The substrate may be any of those described above with respect to FIG. 4A.

In various embodiments, during operation 402, the substrate is placed on the pedestal in the process chamber such that the pedestal is in the lowered position, such as shown in FIG. 1 and in FIG. 3A.

In operations 404-410, an inert gas may be flowed. The inert gas may be any of those described above with respect to FIG. 4A. The inert gas may be flowed to modulate the chamber pressure in various embodiments.

In operation 404, the substrate surface including a non-volatile metal may be modified while the pedestal is in the lowered position. Modification chemistries and process conditions may be any of those described above with respect to operation 454 of FIG. 4A. As described above, the surface may be modified to allow the non-volatile metal to be more susceptible to etching using an organic vapor. Operation 404 may be performed at a low pressure. In some embodiments, the pedestal is in a lowered position during the low pressure regime.

In operation 406, the substrate is moved to a raised position, such as depicted in FIGS. 2A, 2B, 3B, and 3C. In some embodiments, after performing operation 404 and before performing operation 408, the chamber may be optionally purged to remove any excess plasma from the process chamber. The chamber may be purged using any of the process conditions described above with respect to operation 456 of FIG. 4A.

In operation 408, while the pedestal is in the raised position, the modified non-volatile metal may be etched by exposing the substrate to an organic vapor in a high pressure environment. The pressure may be controlled by operating the pedestal in the raised position to obtain a high pressure of the upper chamber region being between about 2 times and about 10,000 times greater than the pressure of the chamber when the pedestal is in the lowered position.

In operation 410, the chamber is purged to remove excess organic vapor from the upper chamber region. The chamber is purged after turning off flow of the organic vapor to the process chamber. The chamber may be purged using any of the gases and methods described above with respect to operation 406. The chamber is purged to prevent any excess organic vapor from being ignited by plasma in any subsequent operations. In various embodiments, the pedestal may be moved to the lowered position before or after purging the chamber. In some embodiments, it may be preferable to purge the chamber prior to moving the pedestal to the lowered position to prevent any organic vapor from being present in the lower chamber region.

In operation 412, operations 404-410 may be optionally repeated. Whether the operations are repeated may depend on the amount of metal on the substrate surface to be etched. As noted above, operations 404-410 may constitute one etching cycle. Any suitable number of etching cycles may be performed to etch the desired amount of material such as a non-volatile metal from the surface of the substrate. The chamber may be purged between operations as described above to separate the organic vapor exposure and the modification operations to prevent the organic vapor from being ignited by modification chemistry in operation 404.

Figure 4C:
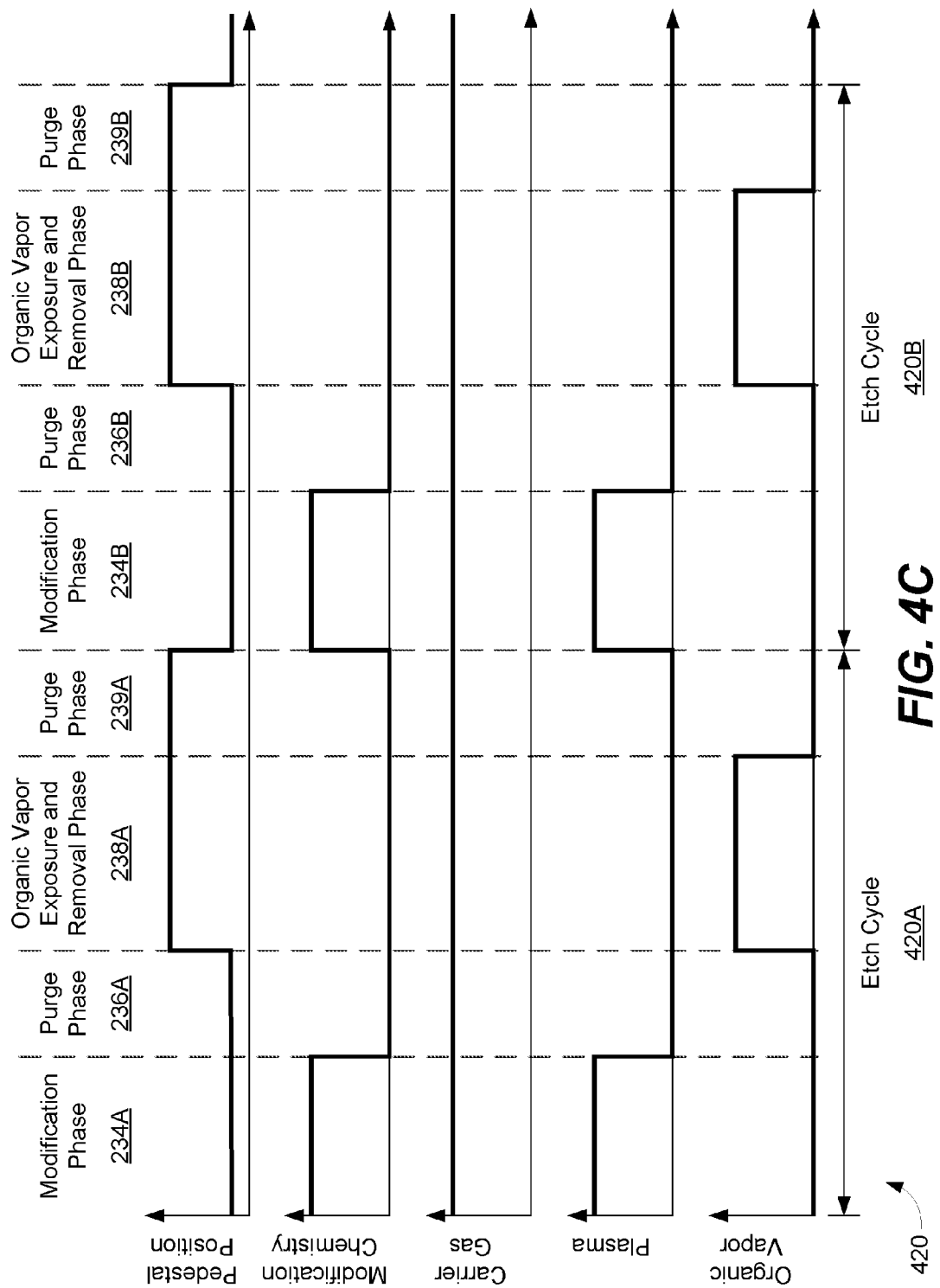
FIG. 4C is timing sequence diagram showing an example of cycles in a method that may be performed in an apparatus in accordance with disclosed embodiments.

FIG. 4C is a timing sequence diagram showing an example of cycles in a method that may be performed in an apparatus as described herein. FIG. 4C shows phases in an example process 420 for various process parameters. The process parameters depicted in FIG. 4C include modification chemistry flow (such as process gases flowed during a modification phase 234A or modification phase 234B), carrier gas flow, plasma (such as whether a plasma is turned on or off), and organic vapor flow. The lines for the gas flows indicate when the flow is turned on and off. The line for plasma indicates when the plasma is turned on and off. The line for pedestal position indicates whether the pedestal is moved to a raised position such as described above with respect to FIGS. 2A, 2B, 3B, and 3C, or to a lowered position such as described above with respect to FIGS. 1 and 3A.

Two etch cycles 420A and 420B are depicted. Each etch cycle includes various phases. For example, etch cycle 420A includes a modification phase 234A, purge phase 236A, organic vapor exposure and removal phase 238A, and purge phase 239A. Likewise, etch cycle 420B includes a modification phase 234B, purge phase 236B, organic vapor exposure and removal phase 238B, and purge phase 239B. As shown, in example process 420, a carrier gas is flowed throughout the etch cycles 420A and 420B. In various embodiments, the carrier gas is used as a purge gas. In some embodiments, the carrier gas may be different than the purge gas. In some embodiments, a carrier gas is only flowed during purge phases (e.g., 236A, 239A, 236B, and 239B). A carrier gas may be any of those described above with respect to FIG. 4A.

In modification phase 234A, the pedestal is in the lowered position such as shown in FIGS. 1 and 3A. The modification chemistry, such as process gases that may be flowed to modify a surface of a substrate (e.g., a non-volatile metal), is flowed while a carrier gas is flowed and the plasma is turned on. Organic vapor flow during this phase is turned off. In some embodiments, the modification phase 234A may correspond with operation 404 of FIG. 4B. In purge phase 236A, the pedestal may remain in the lowered position as shown here as an example. Note that although FIG. 4C depicts the pedestal in the lowered position, in some embodiments, the pedestal may be moved to the raised position during this phase. In such embodiments, this phase may correspond with operation 406 of FIG. 4B. During this phase, a carrier gas or a purge gas may be flowed while all other process gas flows and plasma are turned off. The purge gas may be any of those gases described above with respect to FIG. 4B. In organic vapor exposure and removal phase 238A, the pedestal may be moved to a raised position, the modification chemistry flow and plasma remain off, the carrier gas may continue to flow, and the organic vapor may be flowed. The organic vapor may be any of those described above with respect to FIG. 4A. In some embodiments, the organic vapor exposure and removal phase 238A may correspond to operations 408 of FIG. 4B. In some embodiments, this phase may also correspond to operation 406 of FIG. 4B where the pedestal is moved to the raised position prior to flowing the organic vapor. In various embodiments, the organic vapor is flowed at a high pressure. In purge phase 239A, the pedestal may remain in the raised position while the process gas flows and plasma are turned off and carrier gas may continue to flow. This may correspond with operation 410 of FIG. 4B.

FIG. 4C depicts a second etch cycle 420B, which may correspond to operation 412 of FIG. 4B, where operations 404-410 are repeated. Like etch cycle 420A, during modification phase 234B, the pedestal is moved to a lowered position and modification chemistry flow and plasma is turned on, while organic vapor flow is turned off. Carrier gas may continue to flow. After the chamber is purged in purge phase 236B where only carrier gas flows, the pedestal may be moved to a raised position where the organic vapor exposure and removal phase 238B is performed. The organic vapor flow is turned on with a carrier gas while the plasma and modification chemistry flow are turned off. Purge phase 239B is performed while the pedestal is in the raised position and all process gas flows and plasma are turned off while carrier gas may continue to flow. Note that as described with respect to FIG. 4B, FIG. 4C depicts embodiments where the organic vapor flow and plasma are not both on during any single phase to avoid the formation of organic plasma species that may be redeposited onto the substrate and difficult to remove, thereby causing impurities and defects in the fabricated device.

Figure 4D:
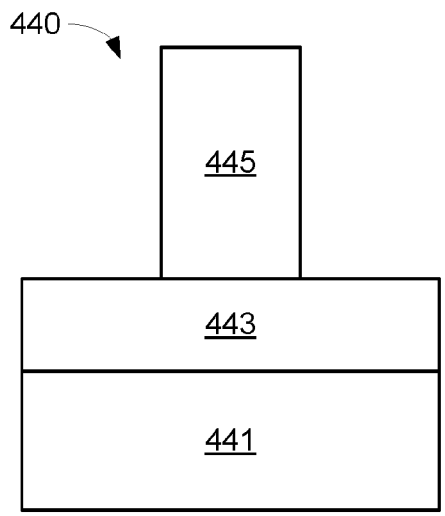
FIGS. 4D-4G are schematic illustrations of example substrates that may undergo a method that may be performed in an apparatus in accordance with disclosed embodiments.

FIGS. 4D-4G depict schematic illustrations of example substrates that may undergo a method that may be performed in an apparatus such as methods described above with respect to FIGS. 4A-4C. FIG. 4D shows an example substrate 440 including a bottom layer 441, which may be a silicon wafer, e.g., a 200-mm wafer, a 300-mm wafer, or a 450-mm wafer, which may include one or more layers of material, such as dielectric, conducting, or semi-conducting material deposited thereon. In this example, a non-volatile metal layer 443 is deposited on the bottom layer 441. Example non-volatile metals include copper, cobalt, platinum, palladium, iron, and iridium. A patterned mask 445 is on the non-volatile metal layer 443 such that some surfaces of the non-volatile metal layer 443 are exposed.

Figure 4E:
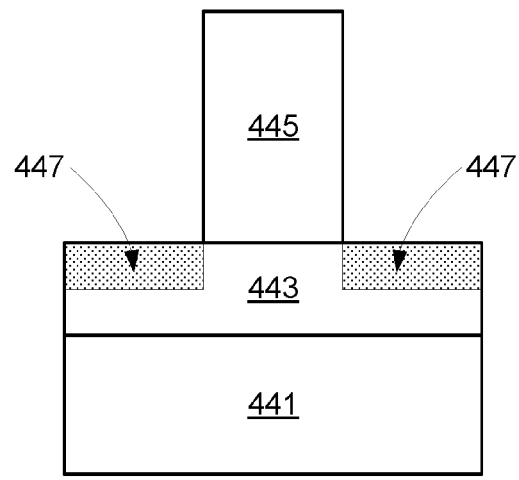

In FIG. 4E, a surface of the non-volatile metal layer 443 is modified to form a modified area 447. Modified area 447 may be modified by exposing the surface of the non-volatile metal layer 443 to a reactive ion etching, ion beam etching, or a non-reactive plasma treatment, such as described above with respect to operation 454 of FIG. 4A. For example, in some embodiments, the modified area 447 may include chlorinated and/or oxidized metal. In various embodiments, this operation may be performed while the pedestal holding substrate 440 is in a lowered position.

Figure 4F:
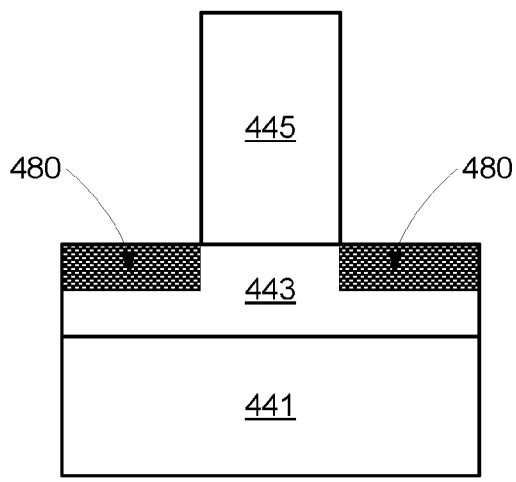
Figure 4G:
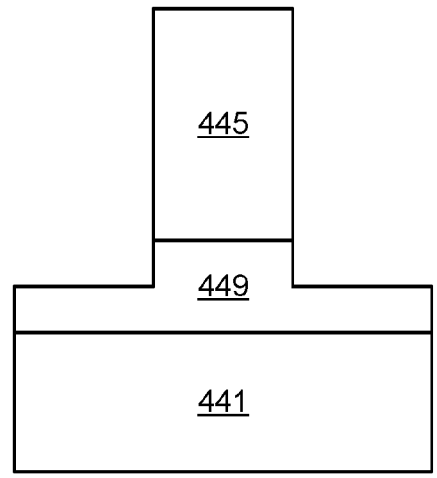

In FIG. 4F, the modified area 447 is exposed to a high pressure organic vapor to form a region 480 that may be easily volatilized. In various embodiments, exposure to the organic vapor causes a reaction between the modified area 447 and the organic vapor to form a compound in the region 480 on the surface of the non-volatile metal layer 443 that may include organic ligands attached to the material of the modified area 447. For example, in some embodiments, the region 480 includes organic ligands attached to chlorinated and/or oxidized metal. Since the region 480 is also exposed to high pressure, the material in region 480 may detach from the non-volatile metal layer 443 to result in the substrate shown in FIG. 4G with an etched non-volatile metal layer 449. In various embodiments, the byproducts generated from reactions between the modified metal layer and the organic vapor may be purged or evacuated from the chamber. Operations may be repeated to further etch the non-volatile metal layer 449 to a desired thickness.

EXPERIMENTAL

Figure 5:
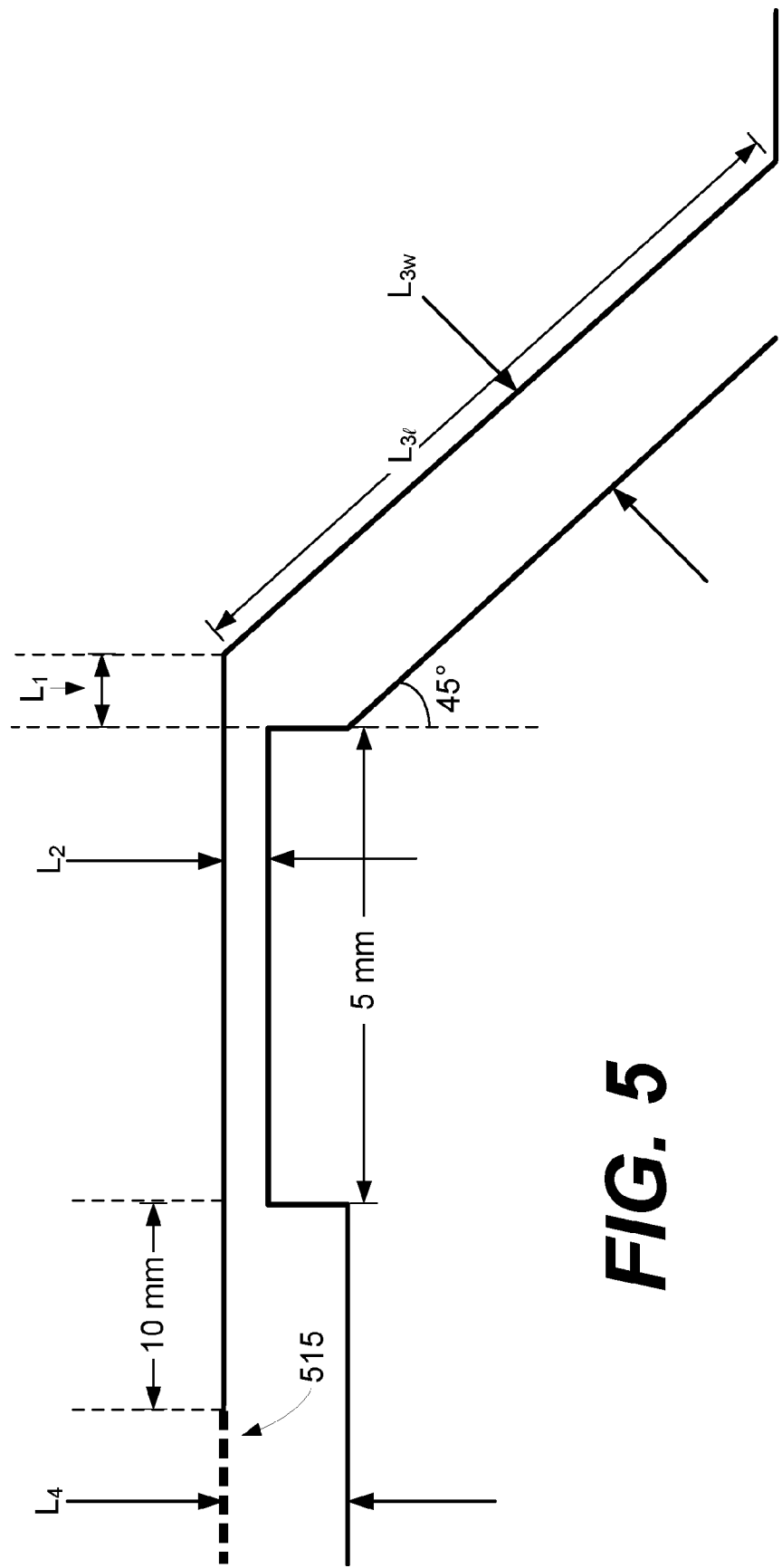
FIG. 5 is a schematic illustration of a region of a process chamber used in experiments.

FIG. 5 depicts annotations used in accordance with the experiments below for various measurements. The experiments were conducted with the pedestal in the raised position. The experiments were conducted in a chamber such as the one depicted in FIGS. 1, 2A, and 2B. For the following experiments, $L_4$ refers to the gap between the showerhead and the surface of the pedestal where the wafer is placed. The distance between the showerhead 515 and the raised region of the edge of the pedestal is 10 mm. The width of the raised region at the edge of the pedestal is 5 mm. $L_2$ refers to the distance between the raised region and the top of the process chamber as depicted in FIG. 5. $L_1$ refers to the distance between the edge of the raised region of the pedestal and the edge where the top of the process chamber is sloped. The angle of the sloped edges of the pedestal edge and the chamber sidewall is 45°. $L_{3l}$ refers to the length of the sloped region of the chamber sidewall at or near the top of the showerhead 515. $L_{3w}$ refers to the distance of the gap between the sloped edge of the pedestal and the sloped sidewall of the chamber. For the following experiments, the process chamber used had a radius of 226 mm, with a showerhead having a radius of 150 mm and the edge of the pedestal that is sloped is a distance 165 mm from the center of the pedestal.

In the tables below, $P_{avg}$ refers to the average pressure, and $\Delta P$ refers to the difference in pressure between the upper chamber region (high pressure region) and lower chamber region (low pressure region). $U_{MM}$ (uniformity maximum-minimum) is a measure of uniformity and non-uniformity, whereby nonuniformity may be defined as the variation of the amount etched across various points of a wafer. A more uniform etch (e.g., $U_{MM}$=0%) results in decreased nonuniformity.

Experiment 1: Toggling Distance $L_2$

An experiment was conducted to measure the pressure differential of the upper chamber region and the lower chamber region for different distances $L_2$. The gap $L_4$ was set at 1 mm. Three trials were performed. For each of the trials, 100 sccm $N_2$ was delivered to the chamber while the pedestal was in the raised position. The results are shown in Table 1 below.

TABLE 1

Pressure Differential and Non-uniformity for Various $L_2$

| $L_2$ (mm) | $L_{3w}$ (mm) | $P_{avg}$ (mT) | $\Delta P$ (mT) | $U_{MM}$ (%) |
|---|---|---|---|---|
| 0.50 | 0.35 | 2500 | 71 | 1.4 |
| 0.75 | 0.53 | 1440 | 126 | 4.4 |
| 0.90 | 0.64 | 1150 | 160 | 7.0 |

As shown in Table 1, gap of 0.90 mm between the raised region of the pedestal and the top of the process chamber resulted in a higher pressure differential between the upper chamber region and the lower chamber region.

Experiment 2: Toggling Distance $L_{3w}$

An experiment was conducted to measure the pressure differential of the upper chamber region and the lower chamber region for different distances of $L_{3w}$. The gap $L_4$ was set at 1 mm. $L_2$ was set at 0.5 mm. Three trials were performed. For each of the trials, 100 sccm $N_2$ was delivered to the chamber while the pedestal was in the raised position. The results are shown in Table 2 below.

TABLE 2

Pressure Differential and Non-uniformity for Various $L_{3w}$

| $L_{3w}$ (mm) | $L_1$ (mm) | $P_{avg}$ (mT) | $\Delta P$ (mT) | $U_{MM}$ (%) |
|---|---|---|---|---|
| 1.12 | 1.0 | 840 | 237 | 14.1 |
| 1.32 | 1.5 | 176 | 269 | 17.6 |
| 1.50 | 2.0 | 735 | 284 | 19.3 |

As shown in Table 2, a width of 1.50 mm resulted in the greatest pressure differential of 284 mT. These results suggest that wafer pressure decreases as the width $L_{3w}$ increases. For $L_{3w}$ greater than the gap $L_4$, the non-uniformity was more than 10%.

Experiment 3: Toggling Distance $L_{3l}$

An experiment was conducted to measure the pressure differential of the upper chamber region and the lower chamber region for different distances of $L_{3l}$. The gap $L_4$ was set at 2 mm. $L_2$ was set at 1.5 mm. $L_1$ was set at 2 mm and $L_{3w}$ was set at 2.06 mm. Two trials were performed. For each of the trials, 100 sccm $N_2$ was delivered to the chamber while the pedestal was in the raised position. The results are shown in Table 3 below.

TABLE 3

Pressure Differential and Non-uniformity for Various $L_{3l}$

| $L_{3l}$ (mm) | $P_{avg}$ (mT) | $\Delta P$ (mT) | $U_{MM}$ (%) |
|---|---|---|---|
| 70 | 267 | 96 | 18 |
| 128 | 288 | 87 | 15.2 |

A longer distance $L_{3l}$ results in a lower pressure differential (87 mT versus 96 mT) and a greater uniformity. A pressure differential is established between the upper chamber region and the lower chamber region along the gap between the pedestal and the chamber sidewall. Experimental results also showed some pressure differential established between the center of the upper chamber region toward the center of the pedestal and the raised region of the pedestal edge.

Experiment 4: Pedestal Height

An experiment was conducted to measure the pressure differential of the upper chamber region and the lower chamber region for different heights or thicknesses of the pedestal. The gap $L_4$ was set at 2.5 mm. $L_2$ was set at 2 mm. Two trials were performed. For each of the trials, 100 sccm $N_2$ was delivered to the chamber while the pedestal was in the raised position. The results are shown in Table 4 below. A larger pedestal height resulted in a similar but lesser pressure differential while $U_{MM}$ decreased slightly thereby being more uniform.

TABLE 4

Pressure Differential and Non-uniformity for
Various Pedestal Heights

| Pedestal Height (mm) | $L_{3l}$ (mm) | $P_{avg}$ (mT) | $\Delta P$ (mT) | $U_{MM}$ (%) |
|---|---|---|---|---|
| 51 | 156 | 300 | 40 | 6.6 |
| 100 | 205 | 326 | 36 | 5.6 |

Experiment 5: Flow Rate

An experiment was conducted to measure the pressure differential of the upper chamber region and the lower chamber region for different flow rates of nitrogen. The gap $L_4$ was set at 2.5 mm. $L_2$ was set at 2 mm. For each of the trials, varying amounts of $N_2$ at a pump pressure of 100 mT was delivered to the chamber while the pedestal was in the raised position. The results are shown in Table 5 below. As shown below, higher flow rate increased wafer pressure and resulted in similar uniformity, though the lower flow rate of 100 sccm resulted in the most uniform ($U_{MM}$ of 5.6%) of the three trials.

TABLE 5

Pressure Differential and Non-uniformity for Various Flow Rates

| Flow (sccm) | $P_{avg}$ (mT) | $\Delta P$ (mT) | $U_{MM}$ (%) |
|---|---|---|---|
| 100 | 326 | 36 | 5.6 |
| 1000 | 986 | 121 | 6.1 |
| 2000 | 1392 | 172 | 6.2 |

Experiment 6: Pump Pressure

An experiment was conducted to measure the pressure differential of the upper chamber region and the lower chamber region for different pump pressures. The gap $L_4$ was set at 2.5 mm. $L_2$ was set at 2 mm. For each of the trials, 2000 sccm of $N_2$ at varying pump pressures was delivered to the chamber while the pedestal was in the raised position. The results are shown in Table 6 below. As shown, increased pump pressure resulted in higher pressure over the wafer and thus better uniformity.

TABLE 6

Pressure Differential and Non-uniformity for
Various Pump Pressures

| Pump Pressure (mT) | $P_{avg}$ (mT) | $\Delta P$ (mT) | $U_{MM}$ (%) |
|---|---|---|---|
| 100 | 1392 | 172 | 6.2 |
| 200 | 1402 | 171 | 6.1 |
| 300 | 1420 | 169 | 5.9 |
| 400 | 1444 | 165 | 5.7 |
| 500 | 1475 | 162 | 5.5 |

CONCLUSION

Although the foregoing embodiments have been described in some detail for purposes of clarity of understanding, it will be apparent that certain changes and modifications may be practiced within the scope of the appended claims. It should be noted that there are many alternative ways of implementing the processes, systems, and apparatus of the present embodiments. Accordingly, the present embodiments are to be considered as illustrative and not restrictive, and the embodiments are not to be limited to the details given herein.

What is claimed is:

1. A method of etching non-volatile metal on a substrate in a process chamber comprising a showerhead and a movable pedestal for holding the substrate, the movable pedestal capable of being positioned in a raised position or a lowered position such that the movable pedestal in the raised position forms an upper chamber region between the movable pedestal and the showerhead and a lower chamber region beneath the movable pedestal, the method comprising:
    exposing the non-volatile metal on the substrate to a plasma when the movable pedestal is in the lowered position to modify the non-volatile metal and form a modified non-volatile metal; and
    exposing the modified non-volatile metal to an organic vapor when the movable pedestal is in the raised position to remove the modified non-volatile metal,
    wherein a pressure differential is formed in the process chamber between the upper chamber region and the lower chamber region when the movable pedestal is in the raised position.

2. The method of claim 1, wherein pressure of the upper chamber region when the movable pedestal is in the raised position is at least about 2 to about 10,000 times greater than pressure of the lower chamber region when the movable pedestal is in the lowered position.

3. The method of claim 1, further comprising moving the movable pedestal to the raised position to a position wherein a distance between the showerhead and the movable pedestal in the upper chamber region is between about 1 mm and about 2 mm.

4. The method of claim 1, wherein the pressure differential formed between the upper chamber region and the lower chamber region when the movable pedestal is in the raised position is between about 50 mTorr and about 5 Torr.

5. The method of claim 1, wherein the movable pedestal is capable of moving a distance between about 4 inches and about 6 inches between the lowered position and the raised position.

6. The method of claim 1, wherein the organic vapor is delivered to the process chamber during the exposing of the modified non-volatile metal to the organic vapor at a flow rate greater than about 1000 sccm.

7. The method of claim 1, wherein a surface of an edge of the movable pedestal is perpendicular to a surface of the movable pedestal.

8. The method of claim 1, wherein a surface of an edge of the movable pedestal is slanted.

9. The method of claim 1, wherein exposing the non-volatile metal to the plasma comprises introducing a chlorine-containing or oxygen-containing process gas to the showerhead to generate the plasma.

10. The method of claim 1, wherein the thickness of the movable pedestal is between about 50 mm and about 100 mm.

11. The method of claim 1, wherein the movable pedestal comprises an annular raised region adjacent to an edge of the movable pedestal.

12. The method of claim 11, wherein the annular raised region adjacent to the edge of the movable pedestal is capable of enclosing the upper chamber region when the movable pedestal is in the raised position.

13. The method of claim 1, wherein the process chamber further comprises a slanted region adjacent to the showerhead and the movable pedestal comprises a slanted edge, wherein interfacing surfaces of the slanted region adjacent to the showerhead and the slanted edge of the movable pedestal are parallel.

14. The method of claim 13, wherein a distance from an inner corner of a slanted region to an outer corner of the slanted region is between about 50 mm and about 200 mm.

15. The method of claim 13, further comprising moving the movable pedestal to the raised position such that an interface of the slanted edge of the movable pedestal and an interface of the slanted region adjacent to the showerhead contact each other to form an enclosed upper chamber region.

16. The method of claim 13, wherein the slanted region adjacent to the showerhead and the process chamber are part of one monolithic structure.

17. The method of claim 13, wherein moving the movable pedestal to the raised position adjusts the size of an adjustable gap between the slanted edge of the movable pedestal and the slanted region adjacent to the showerhead.

18. The method of claim 17, wherein the size of the adjustable gap between the slanted edge of the movable pedestal and the slanted region adjacent to the showerhead is between about 0.3 mm and about 3 mm.

19. An apparatus for processing a semiconductor substrate, the apparatus comprising:
  a process chamber comprising:
    a showerhead for distributing process gases to the apparatus,
    a movable pedestal for holding the semiconductor substrate, the movable pedestal comprising a slanted edge and being capable of being positioned in a raised or a lowered position such that the movable pedestal in the raised position forms an upper chamber region between the movable pedestal and the showerhead and a lower chamber region beneath the movable pedestal, and
    a slanted region adjacent to the showerhead capable of aligning with and contacting the slanted edge of the movable pedestal when the movable pedestal is moved to the raised position to form an adjustable gap between the slanted edge of the movable pedestal and the slanted region adjacent to the showerhead;
  inlets coupled to the showerhead for delivering process gases toward the showerhead;
  a plasma generator for igniting a plasma in the process chamber; and
  a controller for controlling operations of the apparatus, the controller comprising machine-readable instructions for moving the movable pedestal to the raised position or lowered position,
  wherein a pressure differential is formed between the upper chamber region and the lower chamber region by varying the adjustable gap between the slanted edge of the movable pedestal and the slanted region adjacent to the showerhead when the movable pedestal is in the raised position, and
  wherein a distance from an inner corner of the slanted region to an outer corner of the slanted region is between about 50 mm and about 200 mm.

20. The apparatus of claim 19, wherein the slanted region adjacent to the showerhead and the process chamber are one monolithic structure.

21. The apparatus of claim 19, wherein the movable pedestal comprises an annular raised region adjacent to the slanted edge of the movable pedestal.

* * * * *